United States Patent
Kijima et al.

(10) Patent No.: US 8,788,981 B2
(45) Date of Patent: Jul. 22, 2014

(54) METHOD OF OPC MODEL BUILDING, INFORMATION-PROCESSING APPARATUS, AND METHOD OF DETERMINING PROCESS CONDITIONS OF SEMICONDUCTOR DEVICE

(75) Inventors: Mihoko Kijima, Tsukuba (JP); Kyoungmo Yang, Mito (JP); Shigeki Sukegawa, Hitachinaka (JP); Takumichi Sutani, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 656 days.

(21) Appl. No.: 12/062,133

(22) Filed: Apr. 3, 2008

(65) Prior Publication Data

US 2008/0250380 A1 Oct. 9, 2008

(30) Foreign Application Priority Data

Apr. 4, 2007 (JP) ................................ 2007-098674

(51) Int. Cl.
*G06F 17/50* (2006.01)
(52) U.S. Cl.
USPC ................... 716/53; 716/52; 716/54; 716/55; 716/56; 430/5; 430/30
(58) Field of Classification Search
USPC ................. 716/4–6, 19–21, 50–56; 430/5, 30
See application file for complete search history.

(56) References Cited

U.S. PATENT DOCUMENTS

| 6,824,937 | B1 * | 11/2004 | Haidinyak ...................... 430/30 |
| 6,829,380 | B1 * | 12/2004 | Choo et al. ..................... 382/144 |
| 7,661,087 | B1 * | 2/2010 | Gennari et al. .................. 716/18 |
| 2002/0160281 | A1 * | 10/2002 | Subramanian et al. ........... 430/5 |
| 2004/0225993 | A1 * | 11/2004 | Taoka et al. ...................... 716/21 |
| 2006/0108524 | A1 * | 5/2006 | Nagatomo et al. ............. 250/310 |
| 2007/0022401 | A1 * | 1/2007 | Wang .............................. 716/21 |

FOREIGN PATENT DOCUMENTS

| JP | 2003-43663 A | 2/2003 |
| JP | 2006-126532 A | 5/2006 |

OTHER PUBLICATIONS

Japanese Office Action dated Dec. 6, 2011 (Two (2) pages).

* cited by examiner

*Primary Examiner* — Nha Nguyen
(74) *Attorney, Agent, or Firm* — Crowell & Moring LLP (57) ABSTRACT

In a method and apparatus for quantitatively evaluating two-dimensional patterns, a reference coordinate system is set in order to convert pattern edge information (one-dimensional data) acquired by measurement using an existing critical dimension machine into coordinate data. Thus, a pattern is converted into coordinate information. Next, a function formula is determined from this coordinate information by approximate calculation and a pattern is represented by the mathematical expression y=f(x). Integrating y=f(x) in the reference coordinate used when calculating the coordinate data gives the area of the pattern, whereby it is possible to convert the coordinate data to two-dimensional data.

7 Claims, 10 Drawing Sheets

FIG. 1

Length-measurement value

METHOD OF OPC MODEL BUILDING, INFORMATION-PROCESSING APPARATUS, AND METHOD OF DETERMINING PROCESS CONDITIONS OF SEMICONDUCTOR DEVICE

BACKGROUND OF THE INVENTION

1. Field of the Invention

The present invention relates to a method of OPC model building, an information-processing apparatus, and a method of determining the process conditions of a semiconductor device. More particularly, the present invention relates to, for example, OPC modeling used in lithography requiring dissecting a pattern loyal to design data in ultra-microfabrication and in the field of semiconductor processes, and to the utilization of the OPC modeling.

2. Background Art

In the field of semiconductor processes, optical proximity correction (hereinafter referred as OPC) is carried out in some cases, in order to approximate a pattern on a wafer to a desired object (for example, CAD design). OPC is a technique especially effective in forming a microscopic pattern on a wafer.

Methods of OPC include making a length measurement and a comparison of post-transfer pattern sizes using OPC-processed and non-OPC-processed mask patterns to create a database of these pattern sizes and thereby perform mathematical modeling (hereinafter referred to as modeling or OPC modeling). In addition, main types of length-measurement data necessary for modeling include line length-measurement data, space length-measurement data, and hole length-measurement data. A pattern transferred onto a wafer varies in a variety of ways, depending on a difference in the type and size of the pattern and on the combination of a distance between adjacent patterns, a pattern density, and the like. By quantifying and making a database of these variations using length-measurement values, it is possible to define rules for OPC processing. The shape and size of a pattern needed for the process in question are determined on the basis of the created database and these data items serve as one of parameters in device design.

For example, JP Patent Publication (Kokai) No. 2006-126532A (corresponding to US2006/0108524) discloses a method of mask pattern synthesis in which optical proximity correction is performed on a mask pattern identified by design pattern data by applying an OPC pattern from a reference database. This reference database stores data as to what OPC pattern should be disposed on a given design pattern to enable an actual mask pattern to approximate to that design pattern.

SUMMARY OF THE INVENTION

However, length measurement performed in order to build models is generally limited to a horizontal direction or a vertical direction with respect to a pattern. Consequently, it is currently difficult to acquire data for measuring and comparing effects of OPC applied to rectangular corners requiring consideration of oblique components or applied to line ends difficult to compare by simple horizontal and vertical length-measurement values.

Data to be stored in a database is generated by actually forming a pattern and making pass/fail judgments according to the result of formation. Accordingly, it can be said that it is not always possible to rule out human-induced sensory differences (intervention by subjective factors), the uncertainty of judgment criteria, and the like. In addition, such a conventional method as described above has the problem that it takes time to build a database and the process of database building becomes complicated.

This problem occurs because there are currently no effective methods of representing the sizes of a rectangular corner and a line end by one-dimensional numeric values and because algorithms used in existing critical dimension machines (CD-SEM) cannot completely support such two-dimensional measurement. Another reason is that if a two-dimensional pattern cannot be represented quantitatively, it becomes difficult to carry out the determination of the acceptability of OPC, the setting and optimization of OPC threshold values, and the like, without involving personal differences. Consequently, a method required is quantitatively evaluating two-dimensional patterns in order to set common standards and clarify judgment criteria.

The present invention has been accomplished in view of the above-described situation and provides a method capable of quantitatively evaluating two-dimensional patterns and a system to which the method is applied.

In order to solve the aforementioned problems, in the present invention, a reference coordinate system is set in order to convert pattern edge information (one-dimensional data) acquired by measurement using an existing critical dimension machine into coordinate data. Thus, a pattern is converted into coordinate information. Next, a function formula is determined from this coordinate information by approximate calculation and a pattern is represented by the mathematical expression $y=f(x)$. Integrating $y=f(x)$ in the reference coordinate used when calculating the coordinate data gives the area of the pattern, whereby it is possible to convert the coordinate data to two-dimensional data. Then, by digitizing information on the rectangular corners and line ends using this two-dimensional data, it is possible to quantitatively evaluate the degree of pattern deformation and make objective judgments. That is, a difference (for example, the size of an area) observed when a design pattern and an OPC-processed test pattern are overlapped with each other is calculated, and the combinations of the calculated value and OPC pattern and image acquisition conditions (for example, exposure conditions) are classified and compiled into a database.

More specifically, the present invention provides a method of OPC model building intended to quantify optical proximity correction (OPC), wherein a data processing unit compares the areas of OPC-processed electron microscope-based image data and a design pattern, and correlatively classifies and stores the result of comparison with conditions for acquiring the image data in a storage unit.

Furthermore, the present invention provides an information-processing apparatus provided with functions provided by this method of OPC model building.

Yet furthermore, the present invention provides a method of determining process conditions of a semiconductor device by utilizing an OPC modeling built by this method of OPC model building. This method, which determines process conditions of a semiconductor device by utilizing OPC modeling, comprises:

a condition selection step of selecting an OPC pattern and process conditions from a database created by OPC modeling;

a device fabrication step of forming a pattern on a substrate based on the selected process conditions to fabricate a semiconductor device;

an inspection step of inspecting whether or not the fabricated semiconductor device falls within a preset specification; and a process condition determination step of determining process conditions according to the result of inspection;

wherein the database correlatively classifies and stores the result of comparing the area of OPC-processed electron microscope-based image data with the area of a design pattern and conditions for acquiring the image data.

Further features of the present invention will become apparent from the following detailed description taken in conjunction with the accompanying drawings.

DETAILED DESCRIPTION OF THE PREFERRED EMBODIMENTS

Now, embodiments of the present invention will be described with reference to the accompanying drawings. It should be noted however that the embodiments described hereinafter are only examples for embodying the present invention and do not limit the invention. In addition, throughout the drawings, like components are denoted by like reference numerals.

<Schematic Configuration of CD-SEM Apparatus and Evaluation System Provided with the Apparatus>

Figure 1:
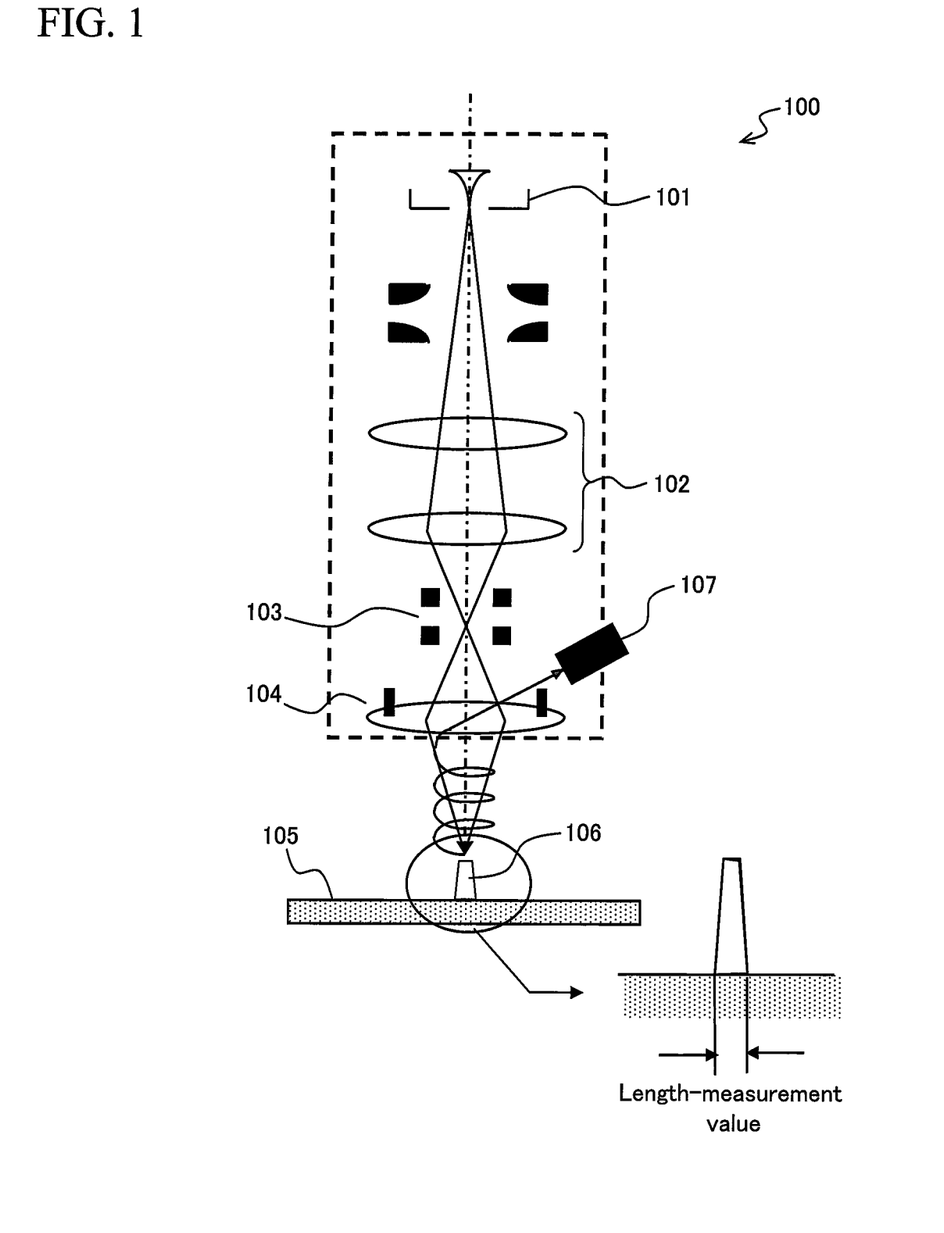
FIG. 1 is a schematic configuration diagram of a critical dimension scanning electron microscope (CD-SEM) and a pattern diagram on a wafer.

In a lithography step which is one of semiconductor manufacturing steps, the sizes of various patterns transferred onto a wafer are verified using a critical dimension scanning electron microscope (hereinafter referred to as the CD-SEM). FIG. 1 is a schematic view illustrating an approximate configuration of a CD-SEM 100.

In FIG. 1, the CD-SEM 100 is provided with an electron beam source 101 for emitting an electron beam, a convergence lens 102 for converging an electron beam, a deflection unit (deflection coil) 103 for deflecting an electron beam to scan a wafer (sample) 105, an objective lens 104 for irradiating an electron beam at a pattern 106 on the wafer 105, and a detection unit 107 for detecting secondary electrons or reflection electrons from the pattern 106.

In the CD-SEM 100 configured as described above, it is possible to measure the size of the microscopic pattern 106 transferred onto the silicon wafer 105 by means of electron beam scanning. In addition, it is possible to carry out automatic length measurement by implementing a recipe which controls length-measurement points, wafer maps, and the like. The length-measurement data thus acquired is utilized for the evaluation of device manufacturing conditions, process control, and the like. In the evaluation of device manufacturing conditions in particular, the measurement of up to several thousand points is carried out and data thus acquired is output.

In the CD-SEM 100, image recognition is performed and measurement points are identified after the model of a pattern on an actual wafer. This means that extraordinary amounts of time and energy are required to create a recipe having a multitude of measurement points. In addition, since an actual wafer is needed when creating a recipe, temporal or physical restraints arise.

Figure 2:
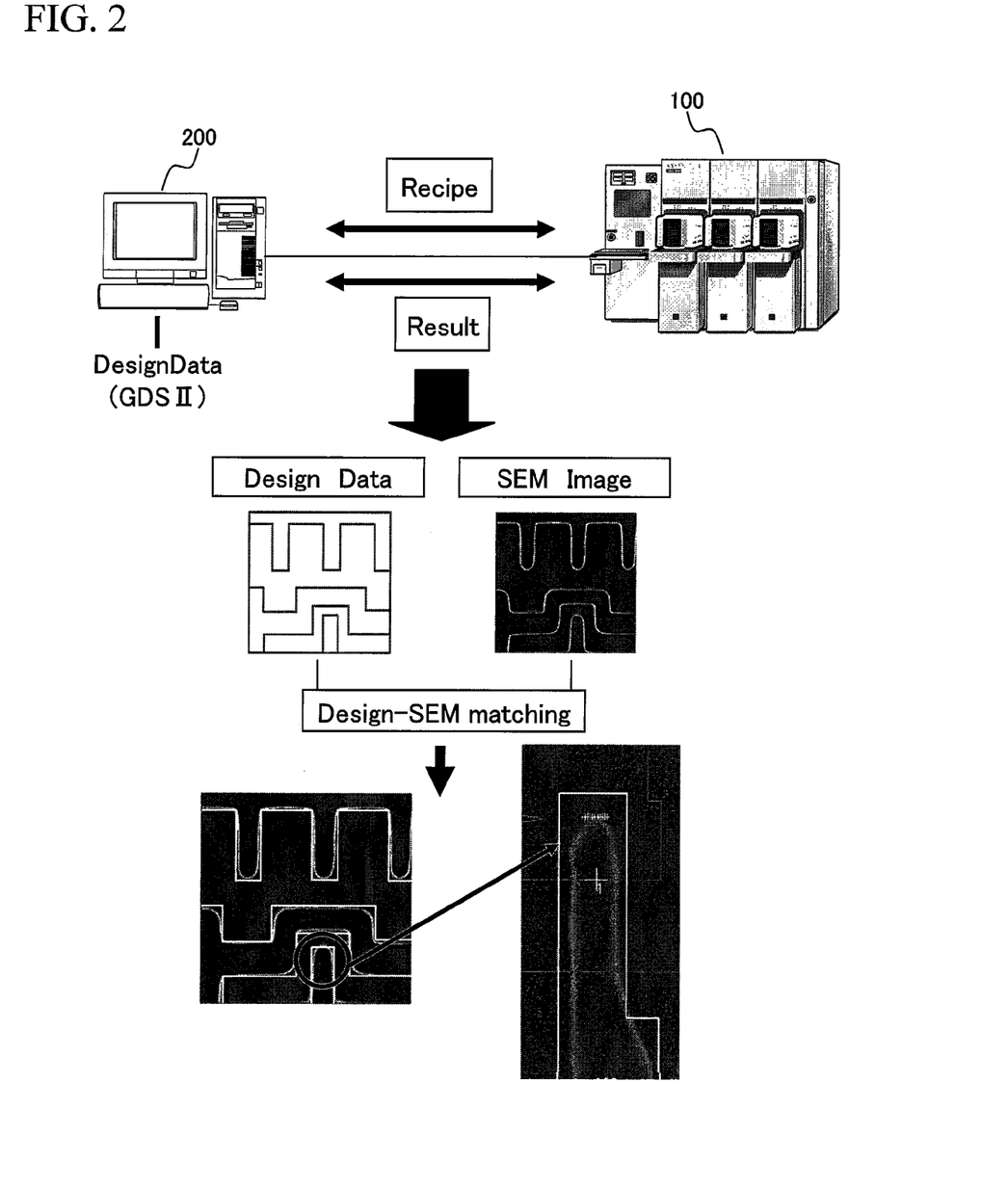
FIG. 2 is a schematic view illustrating an example of a system comprised of a processing unit (design base length-measurement application) and a critical dimension scanning electron microscope, examples of design data and a SEM image, an example of the result of matching between the design data and the SEM image, and an example of the relative positions thereof.

FIG. 2 shows an evaluation system in which image data and length-measurement data are acquired by generating a measurement recipe based on a template making use of design data (CAD data) requiring no wafers at the time recipe creation and remote-controlling the CD-SEM 100 or by using an off-line recipe. The evaluation system shown in FIG. 2 is provided with the CD-SEM 100 configured as shown in FIG. 1 and a processing apparatus 200 which stores design data and recipe data and processes images provided by the CD-SEM 100. The processing apparatus 200 may be connected to the CD-SEM 100 through a network or may be physically connected thereto by means of wiring, as long as recipes or data can be exchanged therebetween. Using such a system as described above, it is possible to alleviate cumbersome work required at the time of recipe creation. It is also possible to visually and quantitatively output the amount deviation of an actual pattern from ideal design data by comparing differences between the design data and images actually obtained using the CD-SEM 100.

The processing apparatus 200 is extremely effective when evaluating the relationship between the design data and the actual pattern. That is, it can be said that use of the processing apparatus 200 is efficient in the evaluation of OPC modeling in which the handling of a vast quantity of measurement points is unavoidable and the verification by comparison with design data is crucial.

<OPC Modeling Processing>

Figure 3:
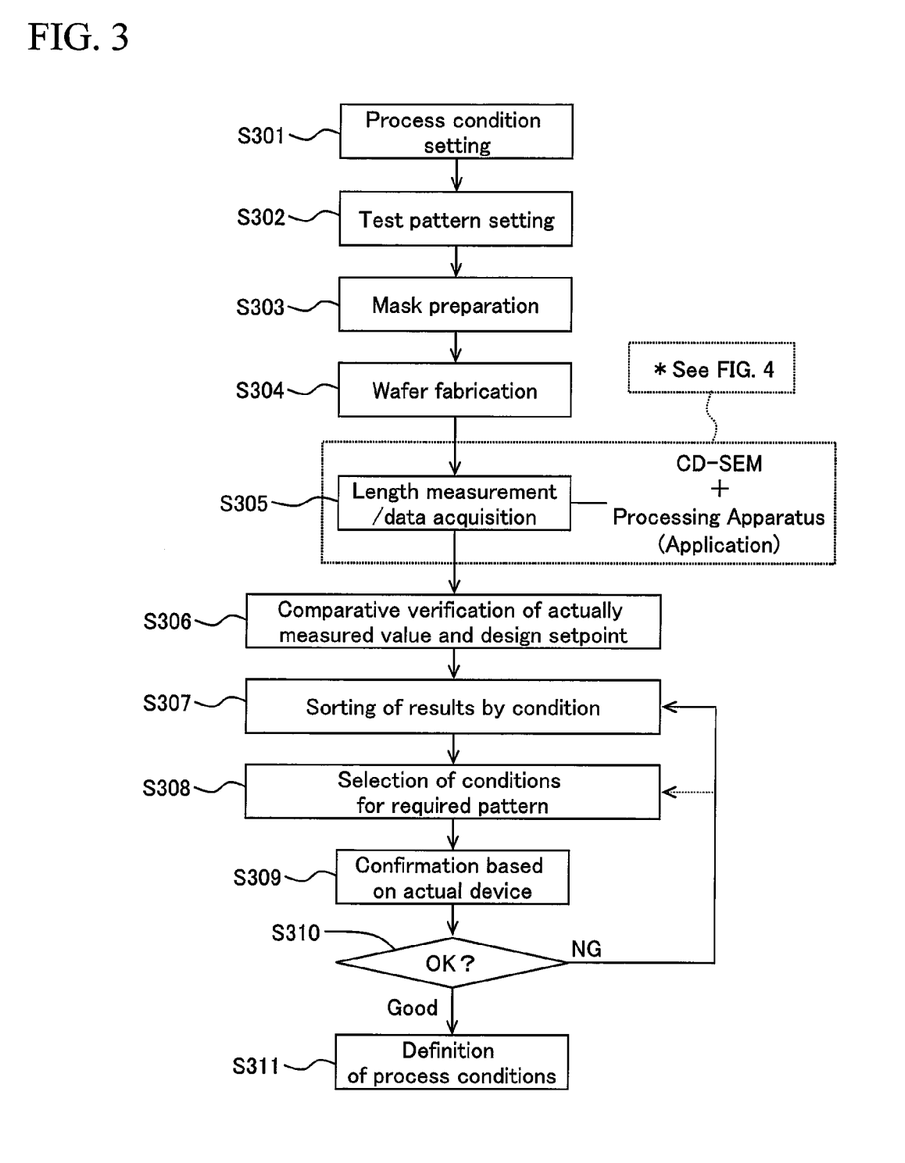
FIG. 3 is a flowchart used to explain a process of OPC modeling and a process of determining process conditions.

(1) FIG. 3 is a flowchart used to explain the details of a process of OPC modeling and a process of determining process conditions. Note that an agent of action in each step is the processing apparatus 200 unless otherwise specified.

In FIG. 3, process conditions are set by an operator in step S301. Note here that the process conditions include the type of apparatus, the material types of substrate, resist and the like, conditions of exposure energy, development and the like, and the combinations of patterning-related conditions. In step S302, there are set the type of repetition of lines, holes, the same pattern and the like, and the sizes, pitches, pattern densities and layouts thereof, etc. for a pattern (test pattern) considered necessary for a process. In step S303, a photomask (reticle) is prepared or the abovementioned test pattern is selected from existing masks on the basis of the conditions set in step S302. In step S304, a resist pattern, or an etching pattern as necessary, is formed on a wafer according to the results of processing in steps S301 to S303.

Figure 4:
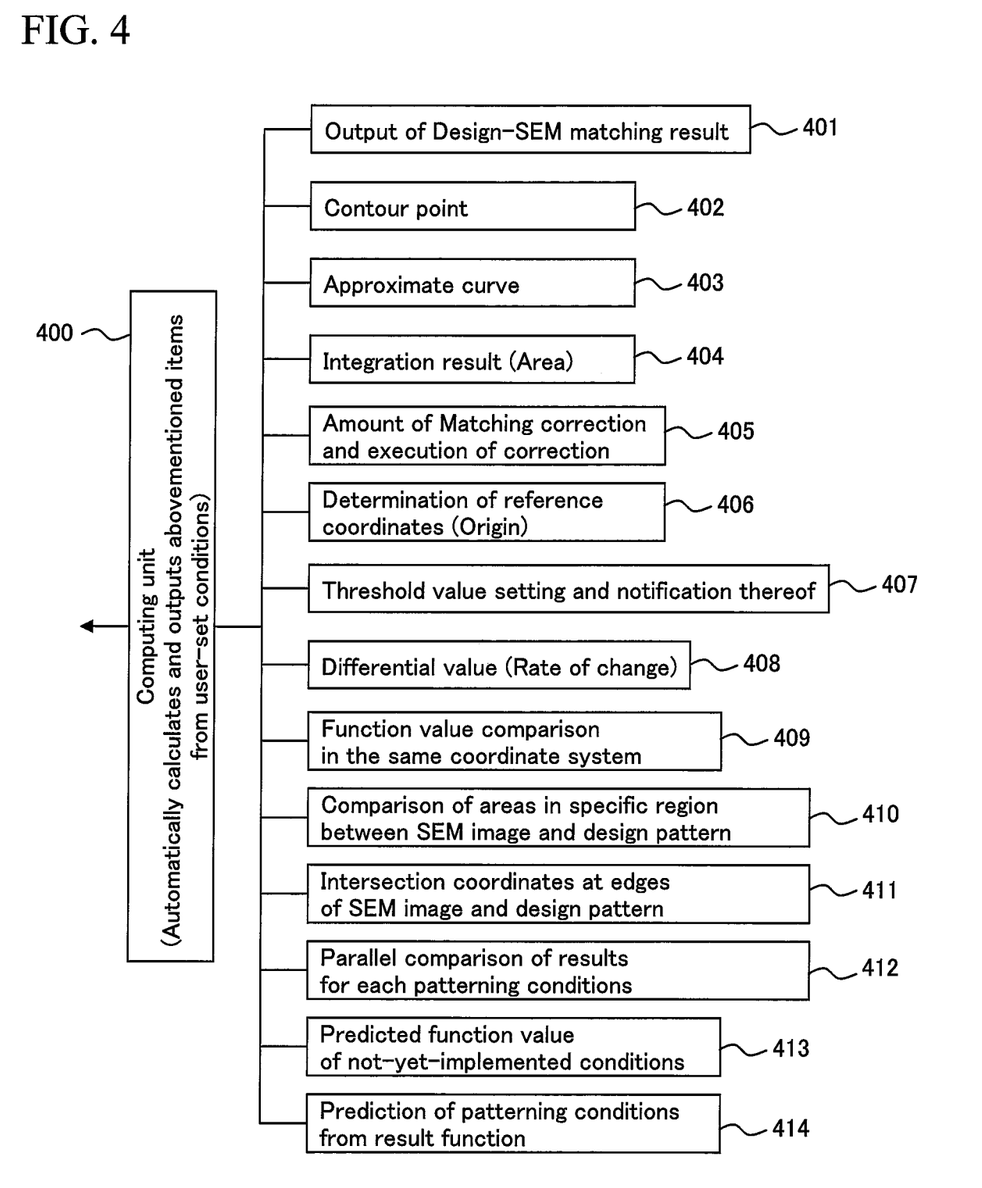
FIG. 4 is a schematic view used to explain the details of the computational functions of a processing apparatus 200.

Subsequently, in step S305, imaging, measurement and length measurement are performed on the formed resist pattern or etching pattern using the functions of the CD-SEM 100 or the CD-SEM 100 plus the processing apparatus (application) 200. Then, respective processes 401 to 414 (described later) shown in FIG. 4 are performed using data obtained by the measurement and length measurement processes, to calculate various data items. The calculated data items include the result of matching between designs and SEM images, edge data (contour points), approximate curves at the edges of the SEM images, the integrated values (areas) of the SEM images, the amount of matching correction, reference coordinate information, threshold values, the differentiated values of the approximate curves (rate of change), the result of comparing function values at the same coordinates, the result of comparing the areas of the SEM images and the design patterns in specific regions, intersection coordinates at the edges of the SEM images and the design patterns, parallel comparison information on the result of patterning for each patterning conditions, information on the predicted values of functions in not-yet-implemented conditions, and patterning conditions predicted from result functions.

In step S306, a comparative verification of pattern values actually measured on a wafer and design setpoints is performed using the abovementioned respective data items obtained in step S305 and in the respective processes shown in FIG. 4. This means that there is a certain discrepancy, both in shape and size, between a design pattern and an actual pattern on a wafer. For example, whereas the design pattern is drawn as a rectangle, the actual pattern is rounded at the corners thereof and is formed of an ellipse as a whole. Accordingly, a comparative verification is made in this step, as to how these differences develop depending on the patterning conditions used and on the shape and size of an OPC pattern. More specifically, a comparison is made between the differential and integral values of the SEM image calculated in a later-described process shown in FIG. 4 and the differential and integral values of the design pattern. Since the design pattern is a collection of rectangles, the differential and integral values are easily calculated, given the axis of coordinate. It is also possible to use areas and gradients. Since the differential and integral values refer to values in a specific region or coordinates, a comparison is made between the respective calculated data items of the SEM image and the design pattern in the region or the coordinates used for calculation. Under certain conditions, the area of the SEM image may become larger, or the opposite may also be true. In addition, there are obtained such results as that the corners of the SEM image are rounded and thereby the area thereof becomes smaller, or the difference in area becomes smaller as the nature of a rectangle is maintained. This means that in step S306, a comparative verification is made of a difference in shape and size depending on conditions.

In step S307, combinations correlated from the results of step S306 are classified (modeling). For example, in the case of OPC having a specific shape, there is obtained such information in step S306 as that an actual SEM image is larger than, smaller than, or not so different in size from, a given design pattern. Consequently, these pieces of information are classified on the basis of the type of OPC. Alternatively, the information may be classified on the basis of other conditions, for example, exposure conditions or an OPC layout. Then, the results of modeling are accumulated in a database. Note that since exposure conditions are composed of even more various items, the information may be classified on the basis of these items.

In step S308, conditions whereby a required pattern and size can be obtained are selected from the result of modeling in step S307 on the basis of the circuit diagram of a semiconductor device desired to be actually fabricated. That is, the semiconductor device must fall within the preset specification in an electrical characteristic test conducted in the final step of device fabrication. Consequently, it is possible to specify a pattern size and the tolerable degree of pattern deformation to a certain extent from this specification. Thus, conditions which satisfy these criteria are selected. Note that if there are any criteria restricted in terms of process, these criteria can be made even more stringent. In a case where a plurality of combinations of conditions are selectable, one of these combinations is finally selected by an operator.

In step S309, the semiconductor device actually fabricated is verified by the operator. Then, if the fabricated semiconductor device proves to be an expected device in step S310, the process goes to step S311 and process conditions are decided. These process conditions can be used at the time of mass-producing the semiconductor device. As described above, devices are subjected to an electrical characteristics test consisting of several hundred to more than one thousand items for pass/fail judgment in the final step of fabrication. That is, if the test result of a fabricated device falls within a specification, then the device can be said to be an expected device. Examples of electrical characteristics include a parameter known as "Vt" (withstand voltage characteristic) which is a test item used to evaluate transistor performance. This parameter refers to a threshold value at which a transistor no longer functions as a switch when a voltage is incrementally applied to the transistor. With the magnitude of this parameter's value, it is possible to make the pass/fail judgment of the transistor.

On the other hand, if the fabricated semiconductor device is not what it is expected to be, the process goes to step S307 or S308. If an actually obtained pattern shape is not found in OPC models, results composed of a corresponding OPC pattern, process conditions, a pattern shape, and the like are added to a database. Note that the process is controlled to go back to step S307 if the OPC pattern must be changed, or go back to step S308 if it suffices to change the process conditions. The steps described above are repeated until the ideal pattern size is obtained.

(2) FIG. 4 is a schematic view used to explain the details of various processing functions executed using data obtained by measurement/length-measurement processing. The data calculated in FIG. 4 is used in the comparative verification processing of step S306. Note that these functions are designed to work in the CD-SEM 100 or in the CD-SEM 100 plus the processing apparatus 200 (application). More specifically, a computing unit 400 performs functions, from measurement and automatic calculation to result output, for processing units 401 to 414, according to conditions set by an operator.

In FIG. 4, a design-SEM matching processing unit 401 has the function to output a design pattern and a SEM image in a superposed manner. A contour extraction processing unit 402 automatically calculates and outputs arbitrary points on the borderline (edge) of the SEM image. An approximate curve acquisition unit 403 converts the arbitrary points (contour points) obtained by the contour extraction processing unit 402 into coordinate data of a coordinate system. The approximate curve acquisition unit 403 acquires and outputs an approximate line and an approximate curve in the form of functions (pattern approximation functions) using, for example, a least-square method.

Figure 6:
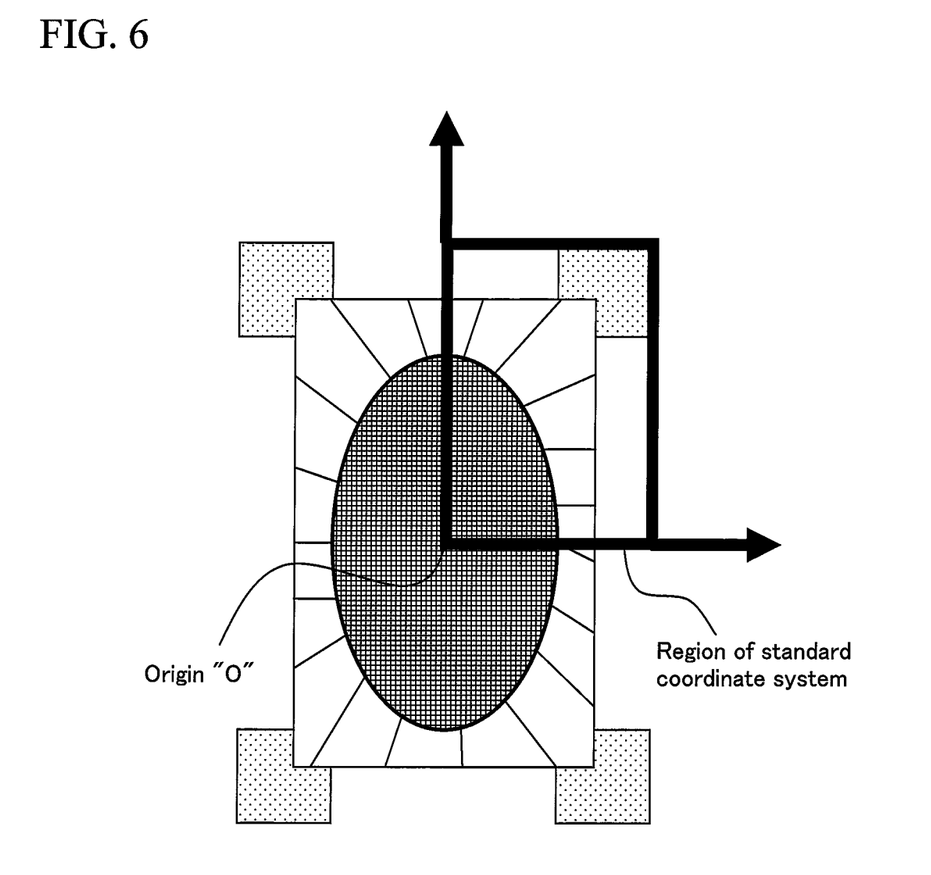
FIG. 6 is a schematic view illustrating an example of extracting OPC-affected regions.
Figure 7:
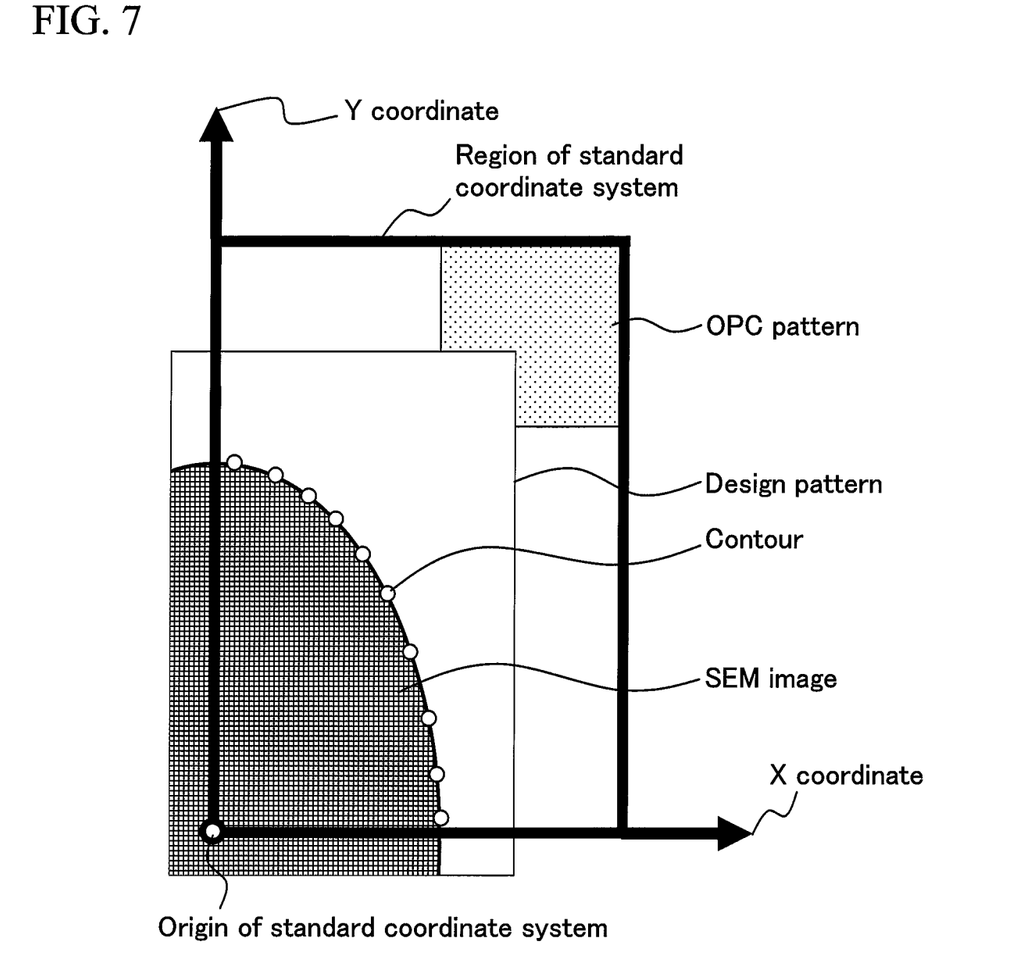
FIG. 7 is an enlarged view of the region of a standard coordinate system shown in FIG. 6.

An integral computing unit 404 integrates a function obtained by the approximate curve acquisition unit 403 across an arbitrary interval of the function and output an area value. At this time, the setting of an integral interval becomes an issue. Since regions arranged at respective vertices and expected to be affected by OPC vary depending the shape and size of an OPC pattern and naturally on the exposure conditions of a wafer, it is difficult to predict these regions. Consequently, it is not practical to classify regions on the basis of the OPC pattern used. In addition, coordinates and a reference point (origin) are required in order to represent edge data by a function. Hence, a middle point between vertices for which OPC is set is used for regional division. In addition, points obtained from edge data are converted into coordinate points by regarding the regions thus divided as a first quadrant, thereby achieving conversion into a coordinate system (see FIGS. 6 and 7).

Figure 5:
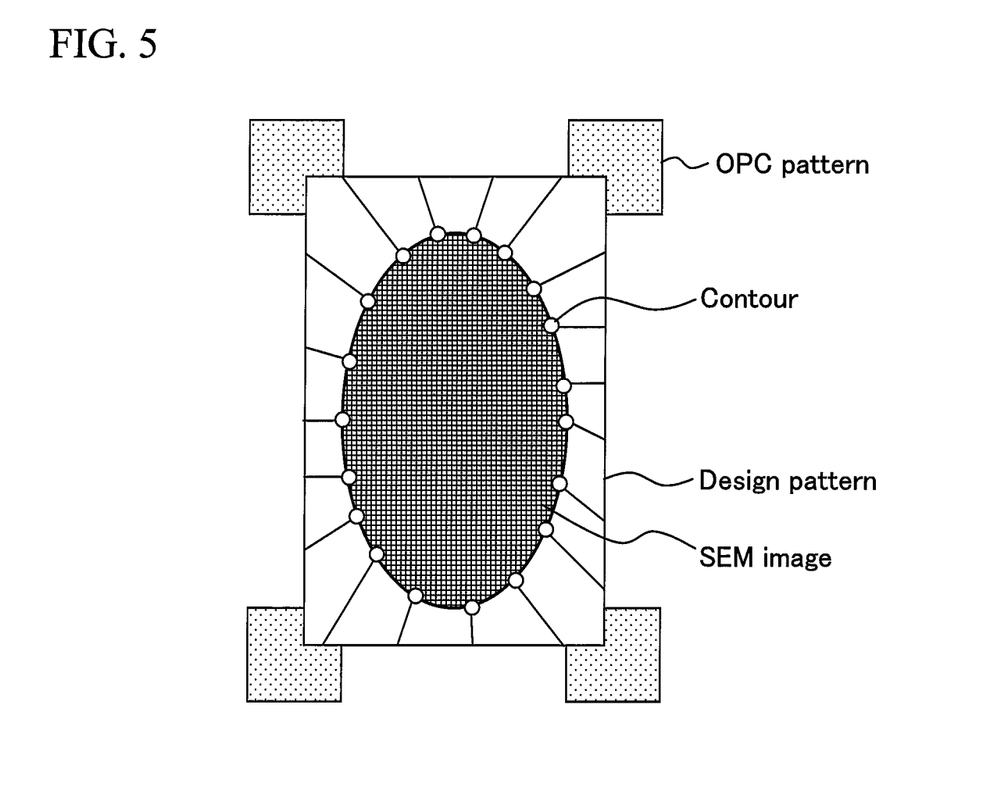
FIG. 5 is a schematic view illustrating superposition between an OPC-processed design pattern and a SEM image.

For an image provided by superposition at the design-SEM matching processing unit 401, a correction processing unit 405 outputs the amount of correction when a correction is made so that the distances of the borderline are the same in X and Y directions and the result of applying the amount of correction to the superposition image. The amount of correction is calculated so that, for example, edge-to-edge distances at the middle point of one side of the design pattern shown in FIG. 5 are the same in the X and Y directions. By correcting the superposition image using this amount of correction, it is possible to precisely perform comparison processing on an area and the like in a case where there is a misalignment or a decentering between the SEM image and the design pattern.

A reference coordinate determination unit 406 defines a region formed by connecting middle points between each two points for which OPC has been set. The reference coordinate determination unit 406 automatically determines and outputs an origin of coordinates on the basis of the definition (rule) that the lower-left vertex of the region is the origin. For example, in the case of FIG. 6, a point "O" is determined as the origin. Likewise, in the case of FIG. 10, points O1, O2 and O3 are determined as origins in their respective coordinate domains.

A threshold comparison processing unit 407 compares, for example, the area value obtained by the integral computing unit 404 and the amount of correction obtained by the correction processing unit 405 with, for example, a threshold value set by an operator (arbitrary value) and notifies comparison result. Note that for these threshold values, it is possible to set the threshold values of, for example, the degree of pattern distortion and pattern sizes, according to an electrical characteristics specification. Accordingly, the resulting resemblance of a SEM image to the shape of a design pattern is not always accepted. In addition, since there is a limit to process capacity, conditions, such as the prohibition of contact with adjacent patterns and discontinuity in a pattern, must be set within that capacity. Threshold values are designed to meet these conditions.

A differential computing unit 408 differentiates the function obtained by the approximate curve acquisition unit 403 at arbitrary coordinates. That is, the differential computing unit 408 calculates a rate of change at the arbitrary coordinates. A function value comparison unit 409 compares the differential value (rate of change) at a certain fixed point obtained by the differential computing unit 408 with the gradient (zero or a constant) of the design, pattern. Thus, the function value comparison unit 409 obtains information used to predict the correlation between SEM image edges and the design pattern.

Figure 9:
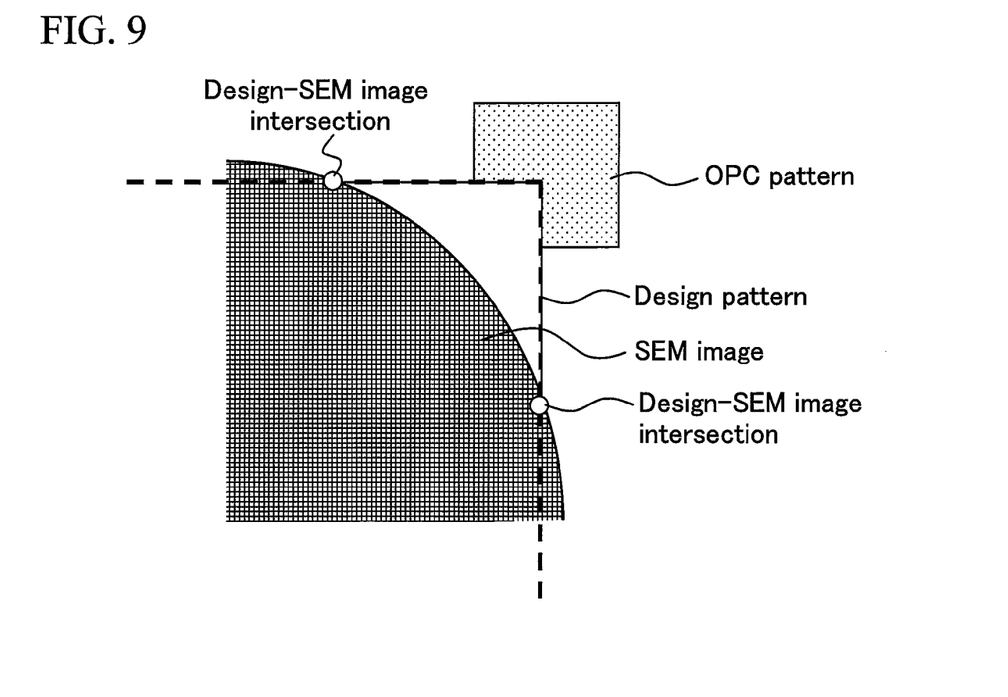
FIG. 9 is a schematic view illustrating an example in which there are intersection points between design pattern edges and SEM image edges.
Figure 10:
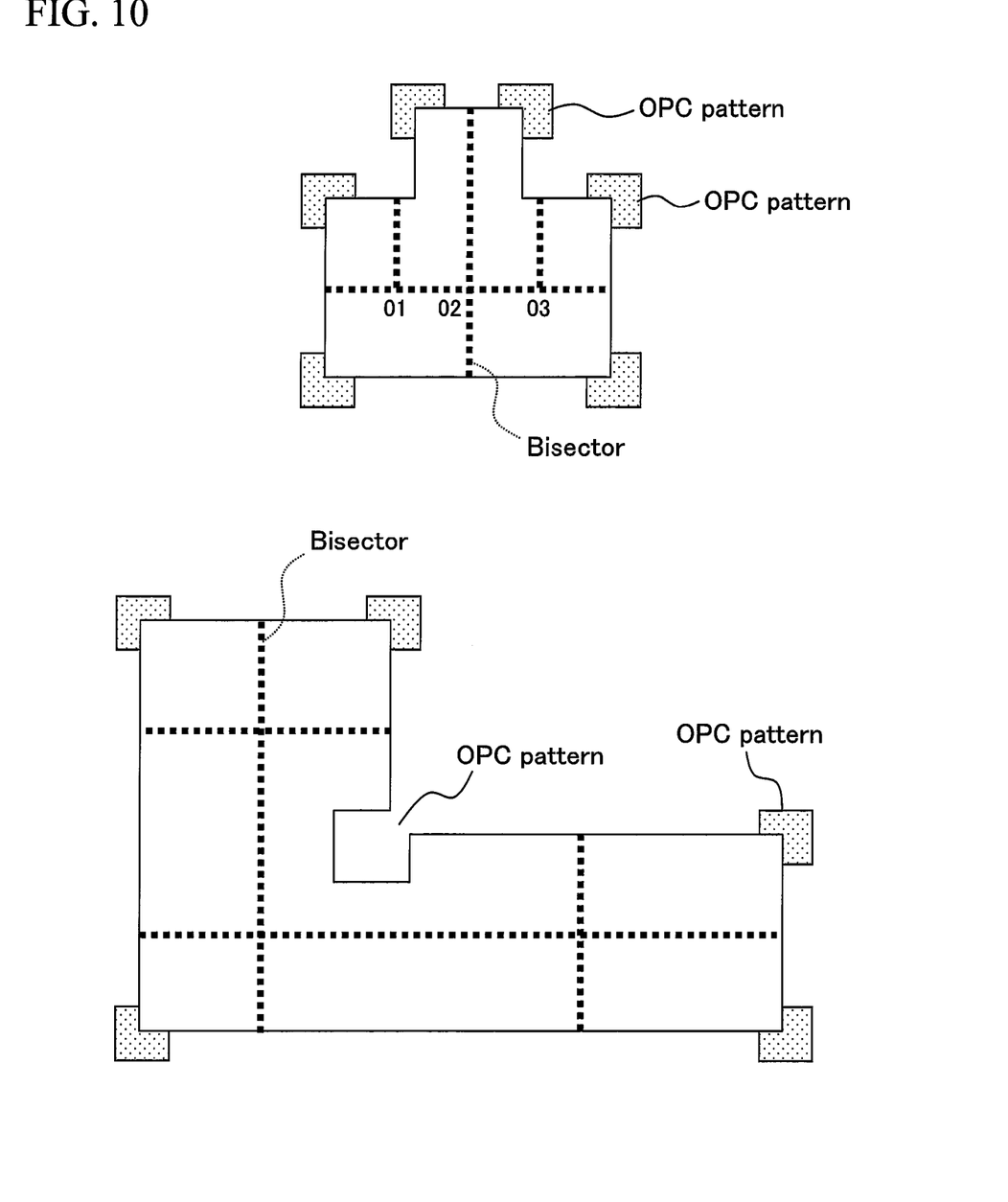
FIG. 10 is a schematic view illustrating an example of the relationship between a design pattern and a position of OPC processing, and regional division.

A specific regional area comparison unit 410 compares a SEM image in a certain region with the area of a design pattern. Although it is optional to specify a region, one region should basically be allocated to one OPC pattern. However, if the OPC pattern extends over a plurality of vertices, the vertices are grouped into one region. FIGS. 9 and 10 show examples of such a way of specifying a region as described above.

There is a case that a design pattern is larger than a SEM image in a region where they overlap with each other, and the opposite is also true in another region. In such a case, an intersection coordinate calculation unit 411 calculates and outputs intersection coordinates in a defined coordinate system for the respective intersection points of a borderline.

A parallel comparison unit 412 classifies the calculated results of the above-described respective processing units 401 to 411 on a condition-by-condition basis and makes an overview comparison, in a case where samples are created under a plurality of conditions. For example, there is a case that it is desired to confirm how a result obtained changes if a condition is varied at certain intervals. There is also a case that the result changes in proportion to the interval of a variation in the condition or the result is obtained with absolutely no relevance to the interval. Hence, for a result provided by each processing unit, the function of the parallel comparison unit 412 makes it possible to confirm, for example, the trends of one or a plurality of items selected by an operator by classifying the items.

A function prediction unit 413 has the function to predict a pattern approximation function for not-yet-implemented conditions utilizing data obtained from already-implemented conditions. A condition prediction unit 414 outputs temporary patterning conditions from the obtained pattern approximation function. Since a database for OPC is built by modeling (step S307), it is possible to utilize the database to predict conditions for a case where similar tests are conducted. In addition, with the prediction function described above, it is possible to avoid such a situation that condition setting proves insufficient after a test is actually conducted.

(3) Specific Examples

Since a size difference arising due to a difference between roughness and denseness in a line pattern or a pattern density in OPC modeling can be measured using a regular length-measurement algorithm, it is easy to set or optimize judgment criteria. On the other hand, there are no algorithms for measuring the degree of influence exerted by corners and line ends of a rectangular pattern when OPC is performed on these corners and line ends. At present, this measurement is left to judgment by visual inspection. In a strict sense, the optimization of process conditions or the like involves personal differences and, therefore, can be said to be less objective.

Hence, as described above, the edge data (contour) of a SEM image is first acquired (see FIG. 1) using the processing apparatus 200 (SEM application) capable of critical dimension patterns with a design base, in order to digitize the degree of deformation in a targeted pattern. Next, (y=f(x)) is calculated by approximate calculation, assuming that the edge data is a coordinate point on an arbitrarily set reference coordinate system. Since the area value of an actual pattern can be obtained by integrating this function over a certain range, it is possible to compare the area value with the area of a design pattern and classify an increase or a decrease or the degree of variation in the area value. Thus, it is possible to quantitatively build OPC models.

Figure 8:
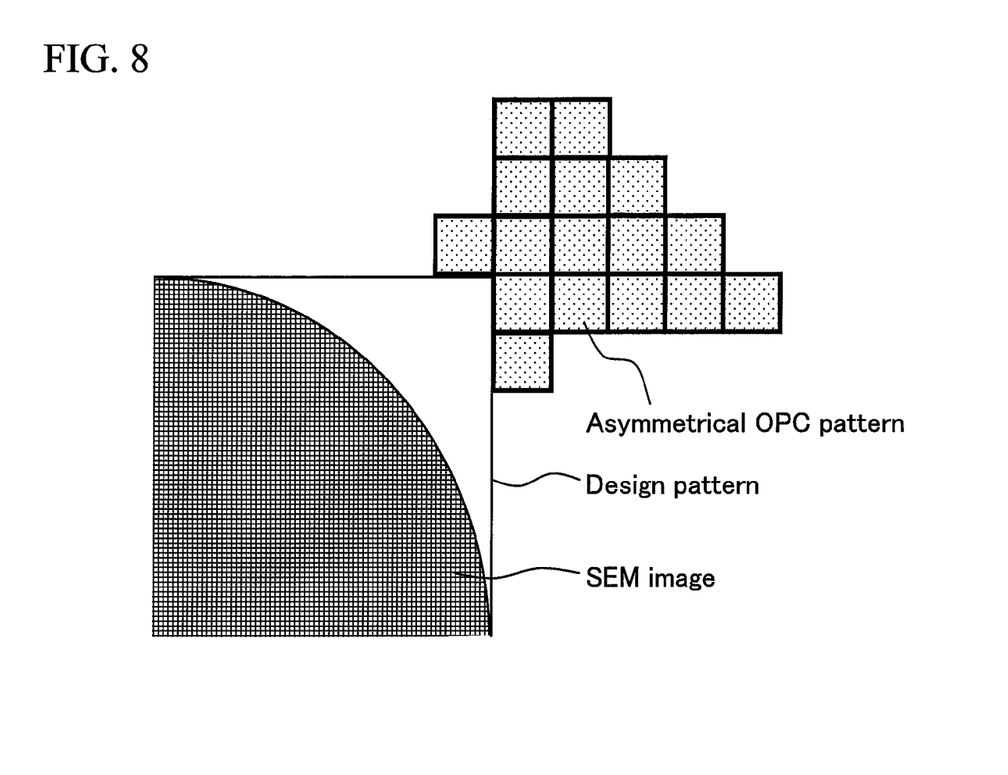
FIG. 8 is a schematic view illustrating one example of an asymmetrical OPC pattern.

An OPC pattern is symmetrical as a rule. Assuming however that the OPC pattern is asymmetrical, there is shown a method of representing the asymmetrical OPC pattern by unit rectangles (see FIG. 8). By representing a decentering in an X or Y direction by the number of these rectangles and correlating a calculated area with the asymmetry of the OPC pattern, the degree of SEM image deformation from design data is digitized.

In addition, in a case where edges of the design pattern and edges of the SEM image intersect with each other, as shown in FIG. 9, these intersection points are defined as the second reference points (first reference point is the origin) of the standard coordinate system. Areas thus divided off with the second reference points as boundaries are defined as positive and negative areas. Consequently, it is possible to solve the problem that an area difference is zeroed even if the design pattern and the SEM image do not precisely overlap with each other.

Figure 11:
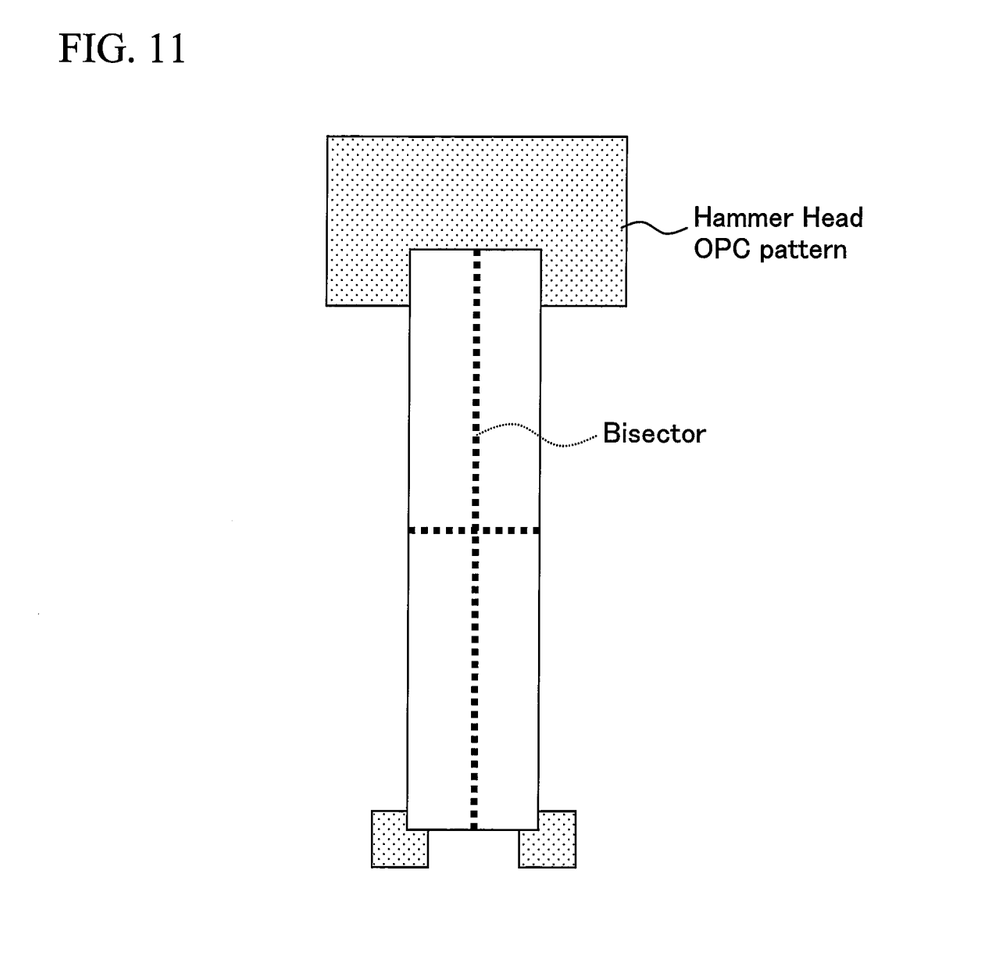
FIG. 11 is a schematic view illustrating an example in which an OPC pattern extends over a plurality of vertices.

Furthermore, if the design pattern is microscopic, as shown in FIG. 11, it may be preferable that a single large pattern known as a hammer head OPC pattern be laid out, rather than disposing two OPC patterns at the leading ends of the pattern.

According to the embodiments heretofore described, it can be expected to build an OPC model whereby the corners and line ends of a rectangle pattern can be quantitatively evaluated.

According to the present invention, it is possible to provide OPC modeling whereby a two-dimensional pattern can be quantitatively evaluated. By utilizing this modeling, it is also possible to efficiently determine the process conditions of a semiconductor device.

What is claimed is:

1. A method of forming an optical proximity correction (OPC) model for quantifying an optical proximity correction process, said method comprising:
    providing design data;
    forming a design pattern based on said design data;
    using an electron microscope to acquire image data of a pattern formed on a wafer using a mask based on said design pattern;
    setting comparison areas with respect to each area on said design data to which an OPC pattern is added;
    acquiring size differences between said image data and said design pattern based on a first comparison for each comparison area;
    classifying sizes of said OPC pattern according to said acquired size differences between said image data and said design pattern for each comparison area; and
    constructing a database which stores a result of said classifying,
    wherein said acquiring and classifying steps are performed by a data processing unit that:
        superposes said image data and said design pattern to achieve matching;
        sets a coordinate system for a specific region;
        calculates an approximate curve that approximates a borderline of said image data in said specific region;
        integration-processes said approximate curve, thereby calculating the area of said image data;
        calculates a gradient of said approximate curve at specific coordinates;
        performs a second comparison of said calculated gradient with a gradient of a corresponding position in said design pattern; and
        correlatively classifies and stores results of said second comparison and the conditions for acquiring said image data in said storage unit.

2. The method according to claim 1, wherein said data processing unit correlatively classifies and stores said result of said first comparison and the conditions for acquiring said image data in a storage unit for each set of image data obtained by applying a plurality of OPC pattern types and a plurality of image data acquisition conditions.

3. An information-processing apparatus for forming optical proximity correction (OPC) models for quantifying an optical proximity correction process, based on selected design data and on OPC-processed image data of a pattern formed on a wafer using a mask based on a design pattern that is formed based on said design data, said image data having been acquired by an electron microscope according to selected acquisition conditions, said apparatus comprising:
    a data processing unit; and
    a data storage unit; wherein,
    said data processing unit is programmed to
        i) perform a first comparison of areas of said image data and said design data;
        ii) classify results of said first comparison and correlate said results with said acquisition conditions; and
        iii) store said results of said first comparison in said storage unit, together with said correlated acquisition conditions;
    said data processing unit is further programmed to set comparison areas with respect to each area on said design data to which an OPC pattern is added;
    said data processing unit acquires size differences between said image data and said design pattern based on a first comparison for each comparison area;
    said data processing unit classifies sizes of said OPC pattern according to said acquired size differences between said image data and said design pattern for each comparison area;
    said data processing unit constructs a database which stores a result of said classification; and
    said data processing unit is further programmed to:
        superpose said image data and said design data to achieve matching;
        set a coordinate system for a specific region;
        calculate an approximate curve that approximates a borderline of said image data in said specific region;
        integrate said approximate curve, thereby calculating the area of said image data;
        calculate a gradient of said approximate curve at specific coordinates;
        perform a second comparison of said calculated gradient with a gradient of a corresponding position in said design data; and
        correlatively classify and store results of said second comparison and conditions for acquiring said image data in said storage unit.

4. The information-processing apparatus according to claim 3, wherein said data processing unit correlatively classifies and stores said result of said first comparison and conditions for acquiring said image data in said storage unit for each of image data obtained by applying a plurality of OPC pattern types and a plurality of image data acquisition conditions.

5. A method of determining process conditions for fabrication of a semiconductor device by utilizing optical proximity correction (OPC) modeling, comprising:
    selecting an OPC pattern and a first set of process conditions from a database created by OPC modeling;
    fabricating a semiconductor device by forming a pattern on a substrate based on said selected first set of process conditions;
    inspecting whether or not said fabricated semiconductor device falls within a preset specification; and
    determining a second set of process conditions according to the result of said inspection; wherein, said database correlatively classifies and stores results of previous comparisons of an area of OPC-processed electron microscope-based image data with a corresponding area of a design pattern, together with corresponding conditions for acquiring said image data; and said database is constructed by,
  providing design data;
  forming a design pattern based on said design data;
  using an electron microscope to acquire image data of a pattern formed on a wafer using a mask based on said design pattern;
  setting comparison areas with respect to each area on said design data to which an OPC pattern is added;
  acquiring size differences between said image data and said design pattern based on a first comparison for each comparison area;
  classifying sizes of said OPC pattern according to said acquired size differences between said image data and said design pattern for each comparison area; and
  constructing said database, which stores a result of said classifying, and said acquiring and classifying steps are performed by a data processing unit that:
  superposes said image data and said design pattern to achieve matching;
  sets a coordinate system for a specific region;
  calculates an approximate curve that approximates a borderline of said image data in said specific region;
  integration-processes said approximate curve, thereby calculating the area of said image data;
  calculates a gradient of said approximate curve at specific coordinates;
  performs a second comparison of said calculated gradient with a gradient of a corresponding position in said design pattern; and
  correlatively classifies and stores results of said second comparison and the conditions for acquiring said image data in said storage unit.

6. The method according to claim 5, wherein said selecting step, said fabricating step, said inspecting step, and said determining step are further repeated if said inspection determines that said semiconductor device does not fall within said specification.

7. The method according to claim 6, further comprising a database updating step of storing a corresponding OPC pattern, process conditions, and an actually obtained pattern in said database, if the pattern of said fabricated semiconductor device differs from an OPC pattern obtained by said condition selection step and a pattern obtained from process conditions.

* * * * *